US006932633B2

(12) United States Patent
Tsai

(10) Patent No.: US 6,932,633 B2
(45) Date of Patent: Aug. 23, 2005

(54) LUG ENGAGEMENT STRUCTURE FOR AN ELECTRICAL CONNECTOR

(76) Inventor: Chou Hsuan Tsai, 15F, No. 4, Lane 127, Sec. 1, Fu-Hsing Rd., Hsin-Chuang City, Taipei Hsien (TW)

( * ) Notice: Subject to any disclaimer, the term of this patent is extended or adjusted under 35 U.S.C. 154(b) by 0 days.

(21) Appl. No.: 10/870,725

(22) Filed: Jun. 16, 2004

(65) Prior Publication Data

US 2005/0130474 A1 Jun. 16, 2005

(51) Int. Cl.[7] .......................................... H01R 13/62

(52) U.S. Cl. ..................................... 439/160; 439/328

(58) Field of Search ........................... 439/160, 157, 439/327–9, 325, 59, 62

(56) References Cited

U.S. PATENT DOCUMENTS 6,319,027 B1 * 11/2001 Pickles et al. .............. 439/160
6,503,093 B1 * 1/2003 Sakata et al. ............... 439/328

FOREIGN PATENT DOCUMENTS

EP 0479517 A2 * 8/1992 ............... 439/160

* cited by examiner

Primary Examiner—Renee Luebke
(74) Attorney, Agent, or Firm—Pro-Techtor International Services

(57) ABSTRACT

A lug engagement structure for an electrical connector. The connector includes a plastic base formed with a receiving slot. The structure can engage with a lateral engagement hole of a circuit board inserted into the electrical connector. The structure includes a board removing component pivoted to the base and rotatable within the slot. A push block extending forward and pressing against the circuit board is arranged on a bottom of the component. A pressing portion and an engagement portion extending forward are arranged on a top of the component. The engagement portion engages with the lateral engagement hole of the circuit board, and the pressing portion can be elastically moved up and down and has a resistant plate. The base has an engagement arm elastically engaging with the component. When the pressing portion is pressed down, the resistant plate is caused to push the arm to separate from and disengage with the component.

6 Claims, 6 Drawing Sheets

LUG ENGAGEMENT STRUCTURE FOR AN ELECTRICAL CONNECTOR

BACKGROUND OF THE INVENTION

1. Field of the Invention

The invention relates to an electrical connector, and more particularly to a lug engagement structure for an electrical connector.

2. Description of the Related Art

Referring to FIGS. 1 and 2, an electrical connector to be connected to a circuit board includes a plastic base 10 and a lug engagement structure 20. A plurality of terminals (not shown) is arranged on the plastic base 10, which is formed with a receiving slot 11 at each side thereof and two pivotal holes 12 on two side surfaces of the receiving slot. A pivot 21, which is to be pivoted to the pivotal holes 12 of the receiving slot 11 of the plastic base 10, is provided in and extends over the lug engagement structure 20. An engagement portion 22, which extends toward the inside of the base, and a pressing portion 23, which extends toward the outside of the base, are arranged on the top of the lug engagement structure 20. The engagement portion 22 may engage with a lateral engagement hole 28 of a circuit board 27. A push block 24, which extends toward the inside of the base and presses against a side of the bottom of the circuit board 27, is arranged on the bottom of the lug engagement structure 20.

When the circuit board 27 is inserted, the circuit board 27 directly presses the push block 24 downward. At this time, the lug engagement structure 20 is rotated counterclockwise, and the engagement portion 22 engages with the engagement hole 28 of the circuit board 27. When the circuit board 27 is to be removed, the pressing portion 23 is pressed down and thus the push block 24 pushes the circuit board 27 upward.

The conventional structure, however, still has the following drawbacks. When the lug engagement structure 20 engages with the circuit board 27, only the engagement portion 22 is utilized to engage with the engagement hole 28 of the circuit board 27, and the lug engagement structure 20 is only pivoted to the plastic base 10 without any engagement action therebetween. Thus, the circuit board 27 may be removed if it is pulled up. Consequently, when the inserted circuit board 27 encounters the corresponding upward/downward impulses, such as vibrations, the circuit board 27 may be caused to separate from the lug engagement structure 20. In this case, it is difficult to ensure the electrical connection state.

SUMMARY OF THE INVENTION

It is therefore an object of the invention to provide a lug engagement structure for an electrical connector, wherein when the circuit board may be definitely fastened to the plastic base so that the electrical connection therebetween may be ensured.

Another object of the invention is to provide a lug engagement structure for an electrical connector, which can ensure the electrical connection to the circuit board and can be operated conveniently.

To achieve the above-mentioned objects, the invention provides a lug engagement structure for an electrical connector. The connector includes a plastic base formed with a receiving slot. The structure can engage with a lateral engagement hole of a circuit board inserted into the electrical connector. The structure includes a board removing component pivoted to the base and rotatable within the slot. A push block extending forward and pressing against the circuit board is arranged on a bottom of the component. A pressing portion and an engagement portion extending forward are arranged on a top of the component. The engagement portion engages with the lateral engagement hole of the circuit board, and the pressing portion can be elastically moved up and down and has a resistant plate. The base has an engagement arm elastically engaging with the component. When the pressing portion is pressed down, the resistant plate is caused to push the arm to separate from and disengage with the component.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 2:
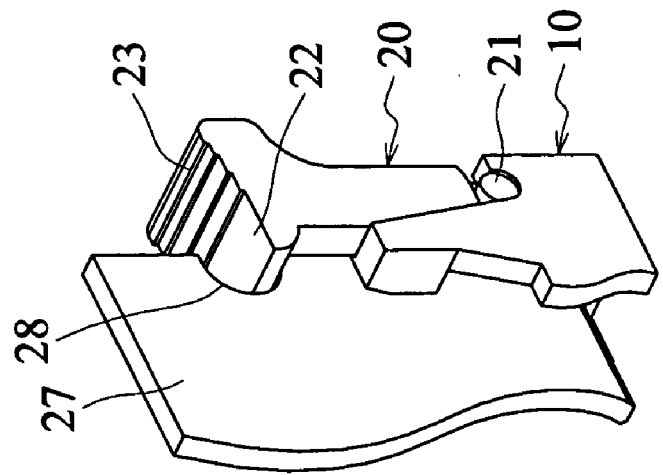
FIG. 2 is a pictorially combination view showing the conventional electrical connector.
Figure 1:
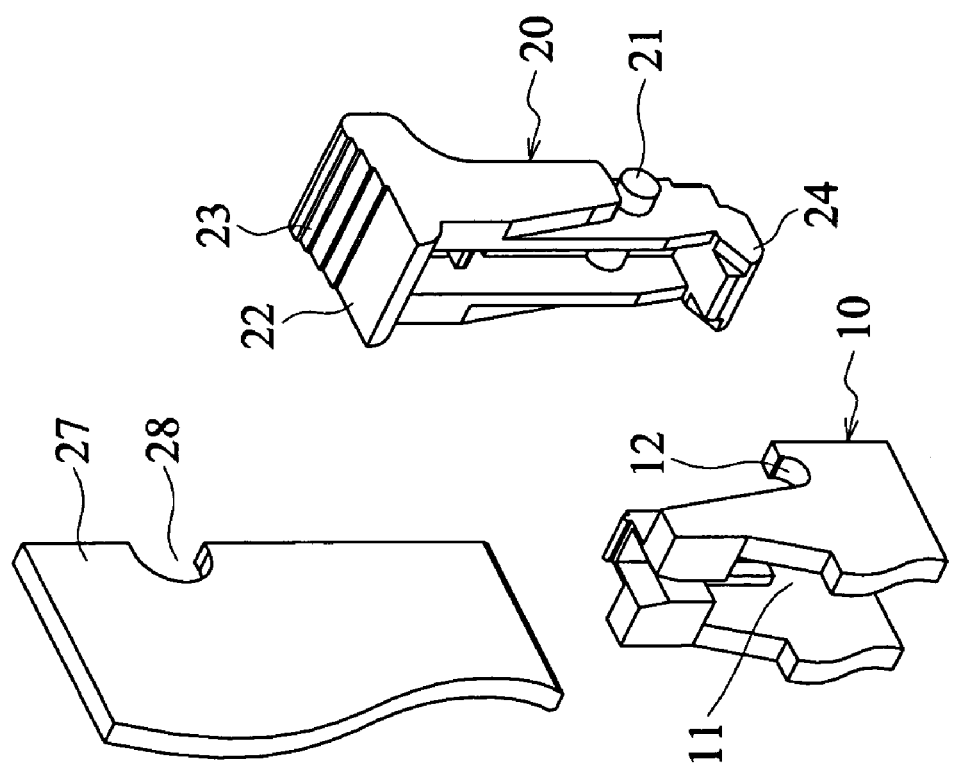
FIG. 1 is a pictorially exploded view showing a conventional electrical connector.
Figure 4:
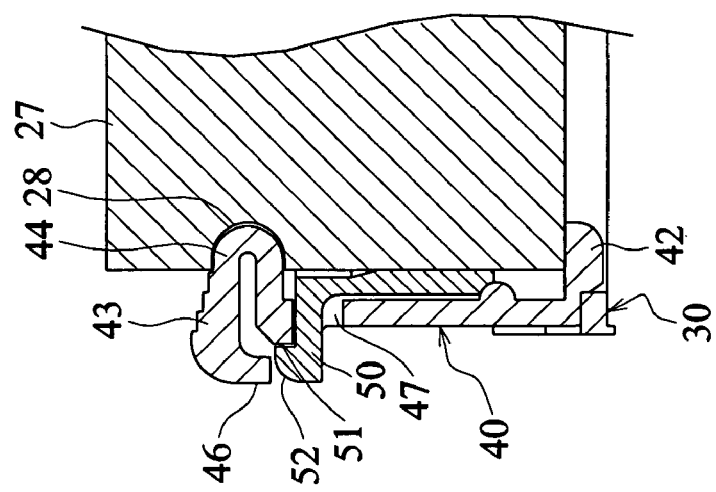
FIG. 4 is a combination cross-sectional view showing the first embodiment of the invention.
Figure 3:
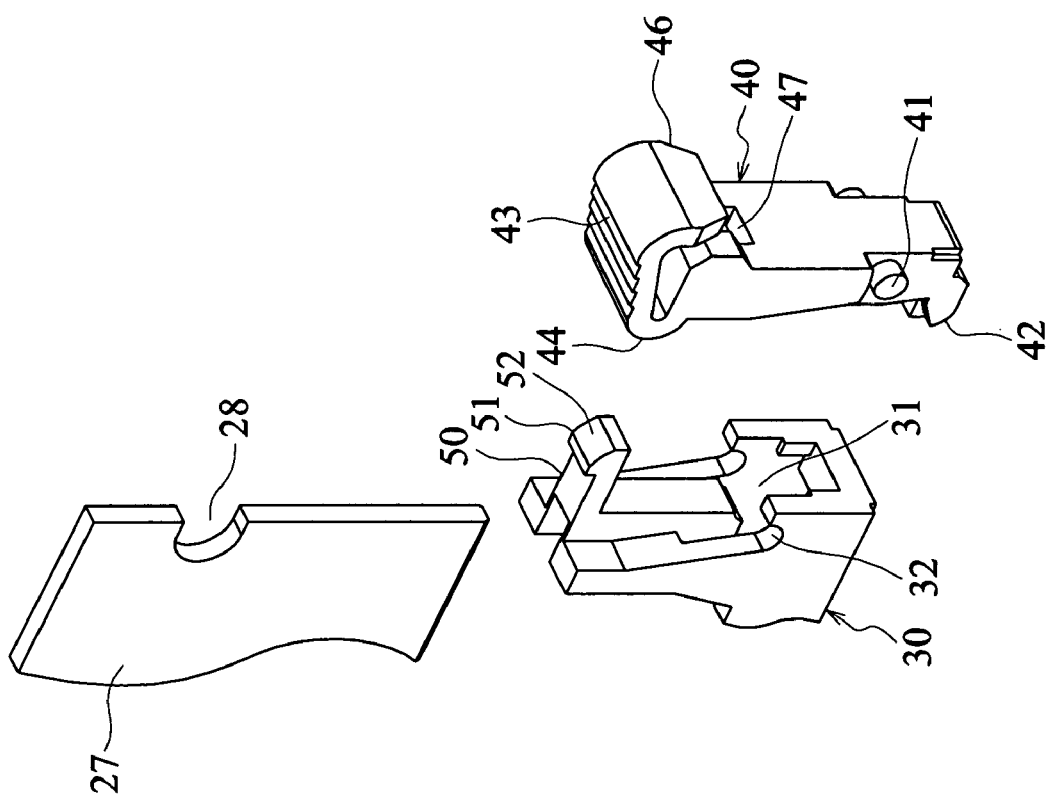
FIG. 3 is a pictorially exploded view showing a first embodiment of the invention.

As shown in FIGS. 3 and 4, a lug engagement structure for an electrical connector of the invention is capable of engaging with a lateral engagement hole 28 of a circuit board 27 inserted into the electrical connector. The electrical connector includes a plastic base 30 and terminals arranged on the plastic base, wherein the terminals are not the key features of the invention and are thus not shown. The lug engagement structure includes a board removing component 40 and an elastic engagement arm 50.

A receiving slot 31 is formed on each of the two sides of the plastic base 30. For the sake of simplicity, only one receiving slot 31 is illustrated. Two pivotal holes 32 are formed at two sides of the receiving slot 31.

The board removing component 40 has a pivot 41 pivoted to the pivotal holes 32 of the plastic base 30, and the pivot 41 may be rotated within the receiving slot 31. A push block 42 extending forward is arranged on the bottom of the board removing component 40. The push block 42 presses against a side of the bottom of the circuit board 27. A pressing portion 43 and an engagement portion 44 extending forward are arranged on the top of the board removing component 40. The engagement portion 44 engages with a lateral engagement hole 28 of the circuit board. The pressing portion 43 is an elastic plate that is one-piece molded and connected to the engagement portion 44. The pressing portion 43 may be moved up and down and has a resistant plate 46 extending downward. In addition, a through hole 47 is formed in the upper section of the board removing component 40.

The elastic engagement arm 50 arranged on the plastic base 30 horizontally and outwardly extends and passes through the through hole 47 of the board removing component 40. The elastic engagement arm 50 has an upward fastener 51 at an external end, and the fastener 51 has a guiding bevel 52. The fastener 51 engages with the middle of the rear end of the board removing component 40. When the pressing portion 43 is pressed down, the resistant plate 46 may be caused to push the elastic engagement arm 50 to bend downward and make the fastener 51 separate from the middle of the rear end of the board removing component 40.

Figure 6:
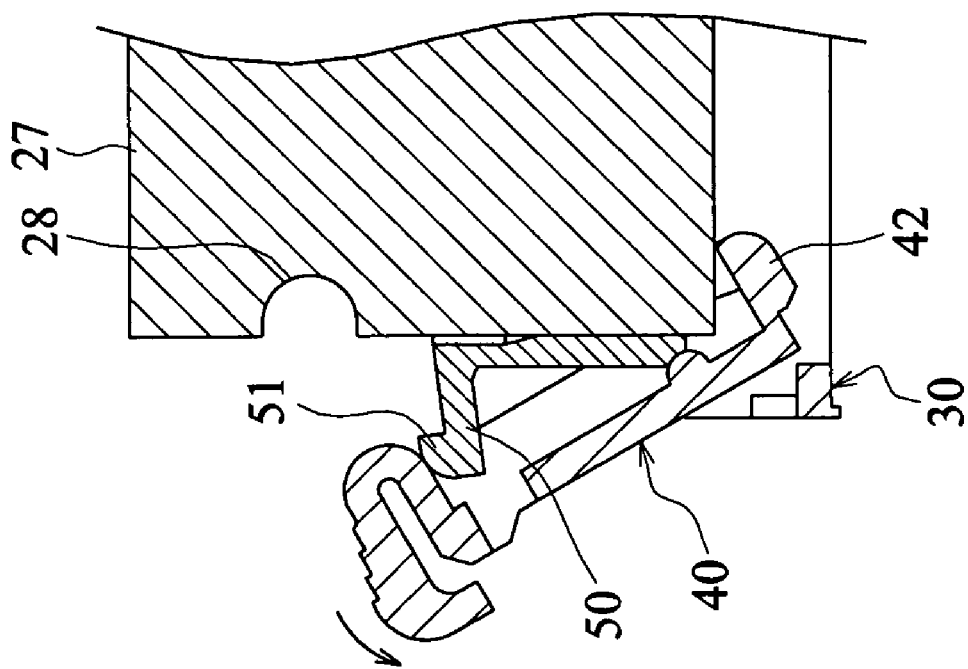
FIG. 6 shows another usage state of the first embodiment of the invention.
Figure 5:
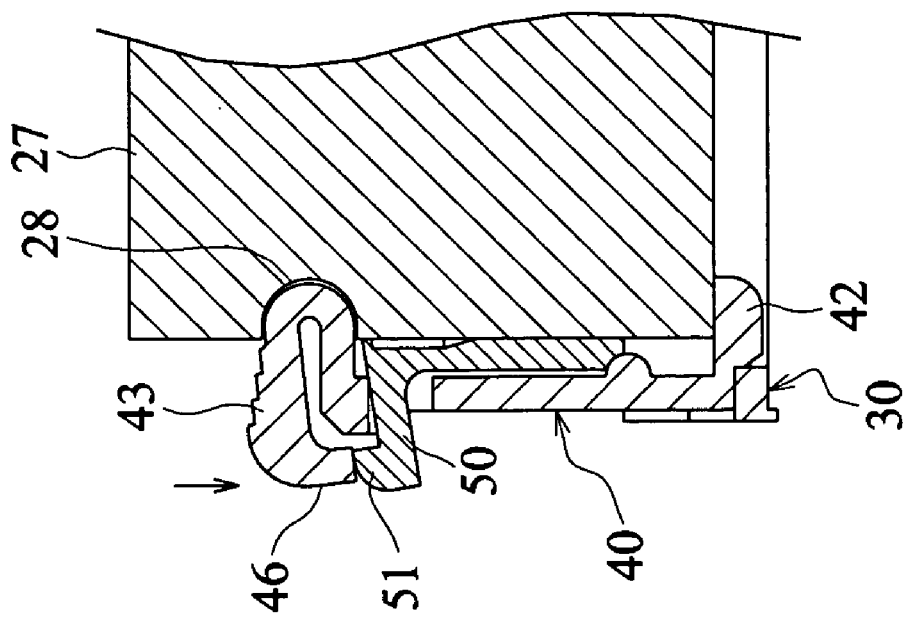
FIG. 5 shows a usage state of the first embodiment of the invention.

As shown in FIG. 4, when the circuit board 27 is inserted into the plastic base 30 to engage the engagement portion 44 of the board removing component 40 with the lateral engagement hole 28 of the circuit board, the rear end of the board removing component 40 is fastened by the fastener 51 of the elastic engagement arm 50 and cannot be rotated relative to the plastic base 30. Thus, the circuit board 27 may be firmly fastened. As shown in FIG. 5, when the circuit board 27 is to be removed, the pressing portion 43 is pressed down to make the resistant plate 46 push the elastic engagement arm 50 to bend downward and disable the fastener 51 from fastening the rear end of the board removing component 40. As shown in FIG. 6, when the board removing component 40 is not fastened by or engaged with the fastener 51, the board removing component 40 can be rotated relative to the plastic base 30. Thus, the push block 42 can push the circuit board 27 up.

As mentioned above, it is concluded that the invention has the following advantages.
  1. After the board removing component 40 has fastened the circuit board 27, it can provide the definite fastening function for the plastic base 30. If the board removing component 40 and the circuit board 27 are not separated, the board removing component 40 cannot be rotated relative to the plastic base 30. Thus, the electrical connection to the circuit board 27 can be ensured.
  2. When the circuit board 27 is to be removed, the separating operation has to be performed. However, the separating operation is performed by directly pressing the pressing portion 43 and thus rotating the board removing component 40. So, the two operations may be performed by pressing the same portion and almost may be combined into one smooth operation. So, the inconvenience of usage will not be caused owing to the design of the fastener.

Figure 8:
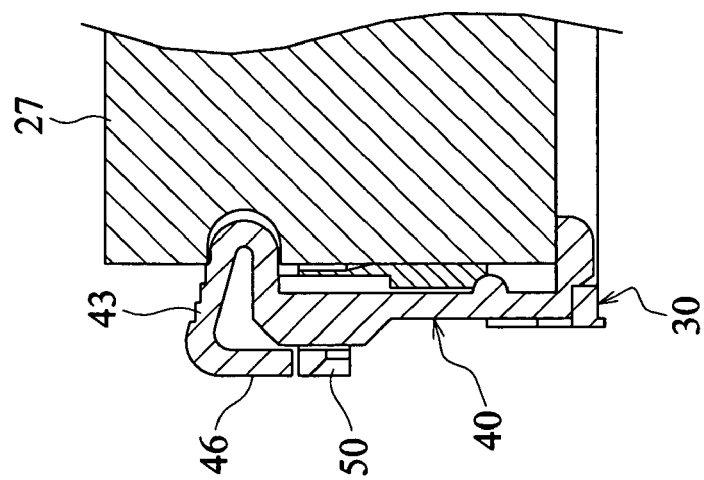
FIG. 8 is a combination cross-sectional view showing the second embodiment of the invention.
Figure 7:
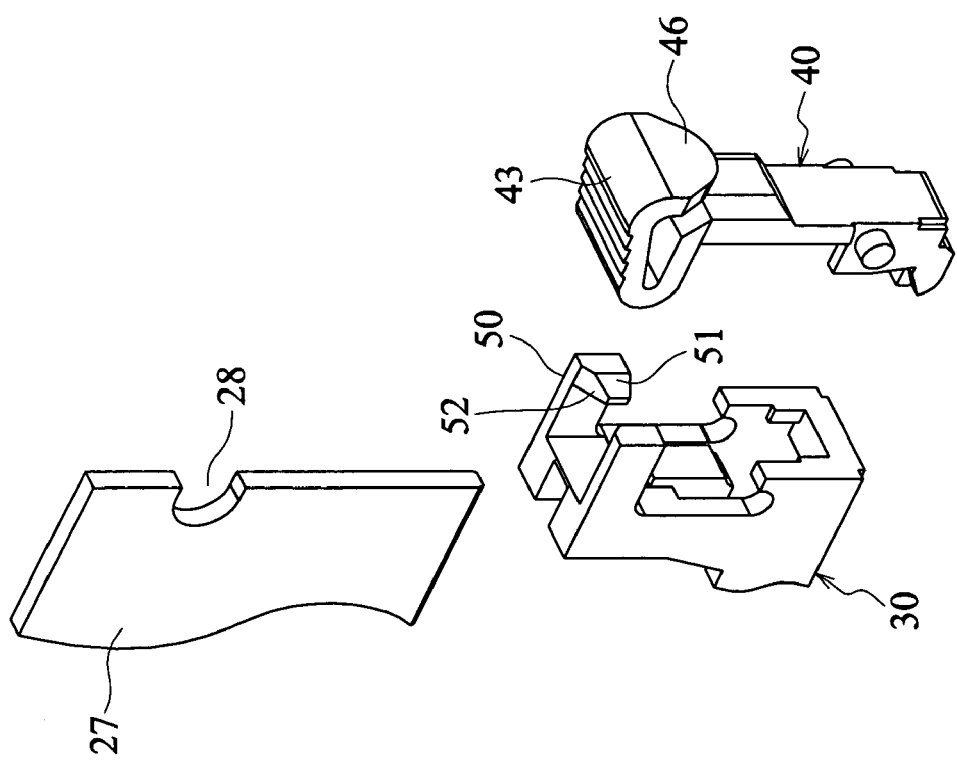
FIG. 7 is a pictorially exploded view showing a second embodiment of the invention.
Figure 9:
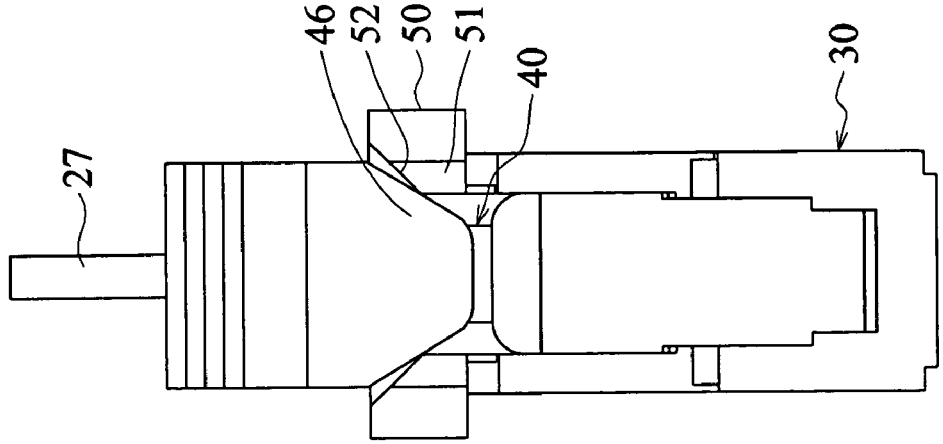
FIG. 9 is a combination rear view showing the second embodiment of the invention.
Figure 10:
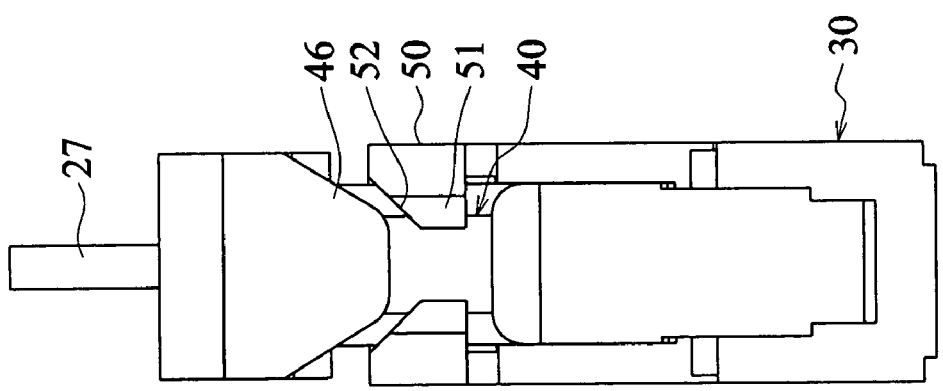
FIG. 10 shows a usage state of the second embodiment of the invention.

As shown in FIGS. 7 and 8, which show a second embodiment of the invention, two elastic engagement arms 50 are arranged at two sides of the plastic base 30. The elastic engagement arm 50 horizontally extends outwards and has an external end formed with an inward fastener 51. The fastener 51 has a guiding bevel 52. As shown in FIG. 9, when the circuit board 27 is inserted, the two fasteners 51 respectively fasten two lateral edges of the rear end of the board removing component 40. As shown in FIG. 10, when the pressing portion 43 is pressed down, the resistant plate 46 thereof presses against the guiding bevel 52 of the fastener 51 such that the elastic engagement arm 50 is elastically and outwardly moved to make the fastener 51 separate from and disengage with the board removing component 40. Therefore, the board removing component 40 may be rotated and the circuit board 27 may be raised.

Figure 12:
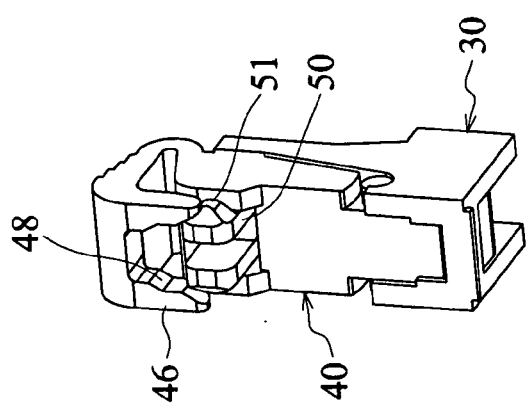
FIG. 12 is a pictorially combination view showing the third embodiment of the invention.
Figure 11:
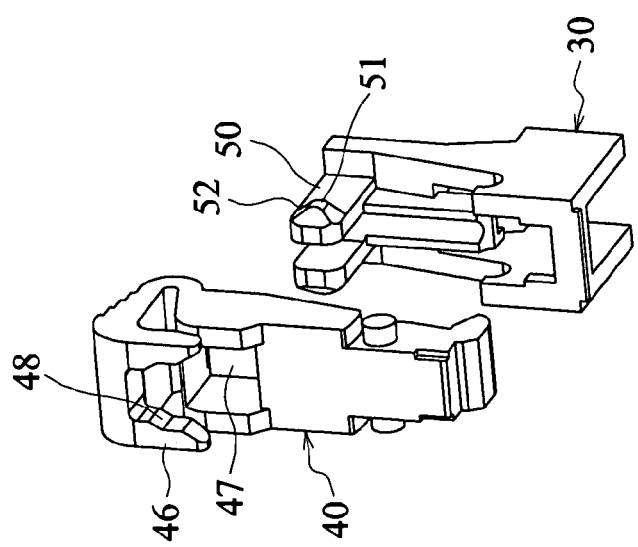
FIG. 11 is a pictorially exploded view showing a third embodiment of the invention.

As shown in FIGS. 11 and 12, which show a third embodiment of the invention, the board removing component 40 also has a through hole 47 at an upper section thereof, and a resistant plate 46 having a guiding slot 48 that is wide at the top and narrow at the bottom. Two elastic engagement arms 50 spaced from each other by a gap are arranged on the middle of a side of the plastic base 30. The two elastic engagement arms 50 horizontally and outwardly extend and pass through the through hole 47 of the board removing component 40. The external end of each arm 50 has a fastener 51 extending outwards. The fastener 51 has a guiding bevel 52. The two fasteners 51 respectively fasten the rear end of the board removing component 40. When the pressing portion 43 is pressed down, the resistant plate 46 thereof presses against the guiding bevel 52 of the fastener 51 such that the elastic engagement arm 50 is elastically and inwardly moved and separated from and disengaged with the board removing component 40.

Figure 13:
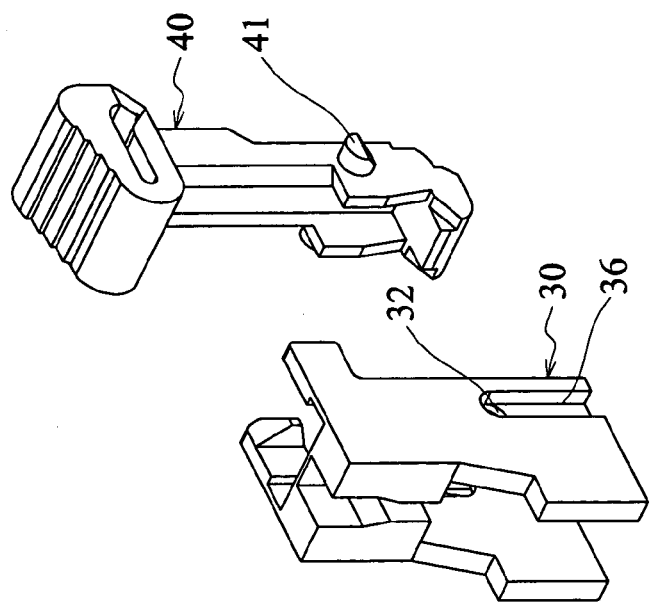
FIG. 13 is a pictorially exploded view showing a fourth embodiment of the invention.

As shown in FIG. 13, a fourth embodiment of the invention is almost the same as the second embodiment except that an open-type groove 36 connected to the pivotal holes 32 of the plastic base 30 is formed when the plastic base 30 is formed by way of plastic injection molding and then released from the mold. In addition, the pivot 41 of the board removing component 40 is configured to a semi-cylindrical structure in order to facilitate the assembling processes.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A lug engagement structure for an electrical connector, the electrical connector including a plastic base having one side formed with a receiving slot, the lug engagement structure being capable of engaging with a lateral engagement hole of a circuit board inserted into the electrical connector, and the lug engagement structure comprising:
  a board removing component, which is pivoted to the plastic base and rotatable within the receiving slot, wherein:
  a push block, which extends forward and presses against a side of a bottom of the circuit board, is arranged on a bottom of the board removing component;
  a pressing portion and an engagement portion extending forward are arranged on a top of the board removing component;
  the engagement portion engages with the lateral engagement hole of the circuit board, and the pressing portion can be elastically moved up and down and has a resistant plate;
  the plastic base has at least one elastic engagement arm elastically engaging with the board removing component; and
  when the pressing portion is pressed down, the resistant plate is caused to push the at least one elastic engagement arm to separate from and disengage with the board removing component.

2. The lug engagement structure according to claim 1, wherein the pressing portion is one-piece molded and connected to an elastic plate of the engagement portion.

3. The lug engagement structure according to claim 1, wherein the board removing component has a through hole through which the at least one elastic engagement arm may pass, and the at least one elastic engagement arm has an upward fastener having a guiding bevel.

4. The lug engagement structure according to claim 1, wherein:
the board removing component has a through hole through which the at least one elastic engagement arm may pass;
the at least one elastic engagement arm has a laterally extended fastener at an external side thereof;
the fastener has a guiding bevel; and
when the pressing portion is pressed down, a resistant plate thereof presses against the guiding bevel of the fastener such that the at least one elastic engagement arm is elastically and inwardly moved and is separated from and disengaged with the board removing component.

5. The lug engagement structure according to claim 1, wherein:
the at least one elastic engagement arm has a laterally extending fastener at an inner side thereof;
the fastener has a guiding bevel; and
when the pressing portion is pressed down, a resistant plate of the pressing portion presses against the guiding bevel of the fastener such that the at least one elastic engagement arm is elastically and outwardly moved and is separated from and disengaged with the board removing component.

6. The lug engagement structure according to claim 1, wherein the receiving slot of the plastic base has pivotal holes at two sides of the receiving slot, the board removing component has a pivot at two sides thereof, and the pivot is pivoted to the pivotal holes of the plastic base.

* * * * *